United States Patent
Chang

[19]

[11] Patent Number: 6,107,666
[45] Date of Patent: Aug. 22, 2000

[54] HIGH DENSITY ROM AND A METHOD OF MAKING THE SAME

[75] Inventor: Kuang-Yeh Chang, Taipei, Taiwan

[73] Assignee: United Microelectronics Corp., Taiwan

[21] Appl. No.: 09/053,023

[22] Filed: Apr. 1, 1998

Related U.S. Application Data

[62] Division of application No. 08/808,260, Feb. 28, 1997.

[30] Foreign Application Priority Data

Nov. 22, 1997 [TW] Taiwan ................................. 85114439

[51] Int. Cl.[7] ........................... H01L 29/76; H01L 29/94; H01L 31/062; H01L 31/113; H01L 31/119
[52] U.S. Cl. ........................ 257/391; 257/390; 257/314; 257/758
[58] Field of Search .................................... 257/390, 758, 257/759, 760, 391, 315; 438/278

[56] References Cited

U.S. PATENT DOCUMENTS

| | | | |
|---|---|---|---|
| 4,877,483 | 10/1989 | Bergemont et al. | 156/653 |
| 5,311,039 | 5/1994 | Kimura et al. | 257/50 |
| 5,621,247 | 4/1997 | Hirao et al. | 257/763 |
| 5,654,576 | 8/1997 | Hsue et al. | 257/390 |
| 5,668,031 | 9/1997 | Hsue et al. | 438/275 |
| 5,847,442 | 12/1998 | Mills, Jr. et al. | 257/536 |
| 5,854,111 | 12/1998 | Wen | 438/275 |
| 5,959,877 | 9/1999 | Takahashi | 365/104 |

*Primary Examiner*—David Hardy
*Assistant Examiner*—Jesse A. Fenty
*Attorney, Agent, or Firm*—Rabin & Champagne, PC

[57] ABSTRACT

The method includes forming a first insulating layer over a substrate. A first metal layer is formed over the first insulating layer. The first metal layer is patterned to form a plurality of parallel bit lines. A second insulating layer is formed over the bit lines and first insulating layer. At least one via is formed in the second insulating layer. Tungsten fills the via to form a tungsten plug. A second metal layer is formed over the second insulating layer. The second metal layer is patterned to form a plurality of parallel word lines. The word lines and the bit lines crosses at an angle. The present invention is also directed toward a high density ROM device that comprises a substrate and at least one memory array, including a first insulating layer located over a surface of the substrate, and a bit line located on a surface of the first insulating layer. The memory array further includes a second insulating layer formed on a surface of the bit line, and at least one via is formed in the second insulating layer and is in communication with the bit line. Plural word lines are located on a surface of the second insulating layer. The bit lines and the word lines cross at an angle.

10 Claims, 5 Drawing Sheets

HIGH DENSITY ROM AND A METHOD OF MAKING THE SAME

This is a Division of Copending application Ser. No. 08/808,260, filed Feb. 28, 1997.

BACKGROUND OF THE INVENTION

1. Field of the Invention

The present invention relates in general to a high density read only memory (ROM) and a method of making the same. More particularly, the present invention relates to a ROM device and a method of making the same using a metal bit line and a metal word line.

2. Description of the Related Art

Read only memories (ROMs) are widely used in minicomputers, microprocessors, and other related digital hardware. ROMs can be used to store system data, for example, a basic input/output system (BIOS) in a personal computer. The manufacturing of a ROM is complicated and time consuming. Therefore, partially completed ROMs are typically produced and stored to reduce delivery time. Once the customer's programming data is received, the partially completed ROMs are programmed to complete the finished product.

Most ROM devices have similar structures, and differ only in the data which is stored during the programming step. Typically, once the integrated circuit (IC) factory receives a programming order from a customer, a mask is produced to perform the programming. This allows production to be rapidly finished, so that the manufacturing time is reduced, thus providing better service to the customers. Therefore, ROMs that are post-programmed with the aid of a mask are commonly used in the art.

In general, channel transistors are used as the memory cells in the ROM. In the programming process, specific channel regions of the channel transistors are selectively implanted with impurities to modify the threshold voltages of the transistors. This controls the conductivity of the memory cell. For a detailed description, reference is made to FIGS. 1A through 1C, in which a conventional ROM device is illustrated. FIG. 1A is a top view of a portion of the known ROM device. FIG. 1B is a front view of a portion of the known ROM device. FIG. 1C is a cross-sectional view of the known ROM device.

The conventional ROM device includes a substrate 10, a plurality of bit lines (BL) 11, an oxide layer 12, and a plurality of word lines 13. Substrate 10 comprises, for example, a P-type substrate. The bit lines 11, oxide layer 12, and the word lines 13 are formed on the substrate 10. As shown in FIG. 1A, the region defined by the dotted line forms a memory cell 14. The data (in binary form such as "0" or "1") is stored in the memory cell by implanting the channel region 16 with impurities.

As shown in FIG. 1C, an N-type dopant, for example, arsenic ions, is doped on the substrate 10 to form bit lines 11, which are arranged with the same distance between each other. Channel region 16 is formed between adjacent bit lines 11. Next, oxide layer 12 is formed on a surface of the bit lines 11 and channel regions 16 using an oxidation process. A conductive layer of, for example, heavily doped polysilicon, is formed over the substrate 10 using a photolithography and etching process to form word lines 13, which cross the bit lines 11. Then, channel transistors are formed to complete the partially manufactured conventional ROM.

To program the partially manufactured ROM, a series of continuous programming steps are performed. A mask 15 is formed over the partially completed ROM, leaving the channel region 16 which is to be encoded exposed. Then, a P-type dopant, for example boron, is implanted to form the code. However, the type of the implanted dopant is selected depending on the characteristics of the transistor.

In the conventional ROM described above, the metal-oxide-semiconductor transistor is difficult to minimize, thus, the device is difficult to integrate. Further, in the manufacturing process of the conventional ROM, the bit lines are formed by doping $N^+$ ions on the substrate. Because the resistance of the bit lines is about 100 ohms per square, which is much higher than the resistance of typical metal conductors, operating current cannot be increased. Further, the lower breakdown voltage of the channel transistor will limit the operating voltage at decoding. These limitations may result in an output error.

SUMMARY OF THE INVENTION

It is therefore an object of the present invention to provide an improved ROM device, and a method of making the same. The invention substitutes a via (vertical electrical connection) for a channel transistor as the memory cell of the ROM. Thus, the invention simplifies the manufacturing process and reduces the manufacturing time.

It is another object of the present invention to use metal as the bit line and the word line to lower the resistance to about $10^{-3}$ ohms per square. Thus, the operating current is increased and the decoding speed enhanced.

It is another object of the present invention to substitute the conventional channel transistor with a metal line. This helps prevent defects such as short channel effect, leakage current, and so on.

Further, it is another object of the present invention to increase the integration of the MOS device. For example, the ROM array can be stacked tridimensionally. This not only increases the integration of the MOS device, but also forms a high density ROM.

The invention achieves the above-identified objects by providing a new method of making a ROM device. The method includes forming a first insulating layer over a substrate. A first metal layer is formed over the first insulating layer. The first metal layer is patterned to form a plurality of parallel bit lines which are spaced from one another at equal intervals, and which all extend in a first direction. A second insulating layer is formed over the bit lines and first insulating layer. At least one via is formed in the second insulating layer. Tungsten is blanketed over the second insulating layer and fills the via. A portion of the tungsten is removed, and a remainder of the tungsten is left in the vias to form a tungsten plug. A second metal layer is formed over the second insulating layer. The second metal layer is patterned to form a plurality of parallel word lines which are spaced from one another at equal intervals and which all extend in a second direction. The first direction crosses the second direction to form an angle. The present invention is also directed toward a high density ROM device, that comprises a substrate, and at least one memory array, including a first insulating layer located over a surface of the substrate, and plural bit lines located on a surface of the first insulating layer and extending in a first direction. The bit lines are spaced from one another at essentially equal intervals. The memory array further includes a second insulating layer formed on a surface of the plural bit lines, and at least one via formed in the second insulating layer and connected to the bit lines at their respective bottoms. Plural word lines are located on a surface of the second insulating layer and extend in a second direction that crosses the first direction to form an angle. The word lines are spaced from one another at essentially equal intervals.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1A:
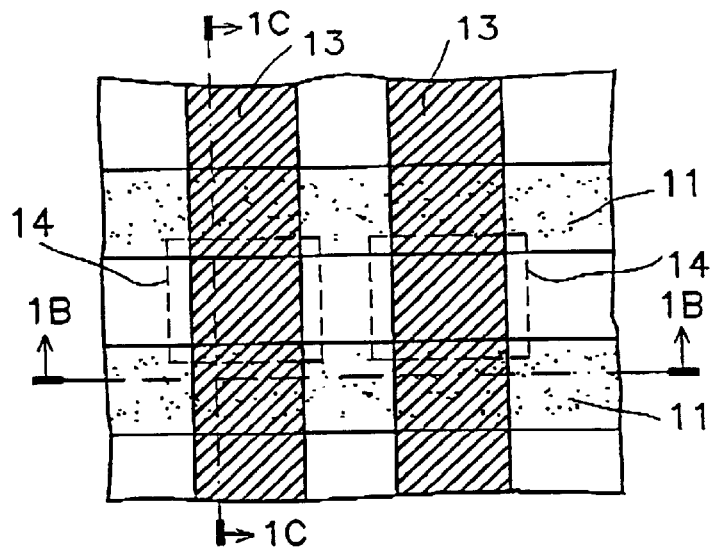
FIG. 1A is a top view of a conventional ROM.
Figure 1B:
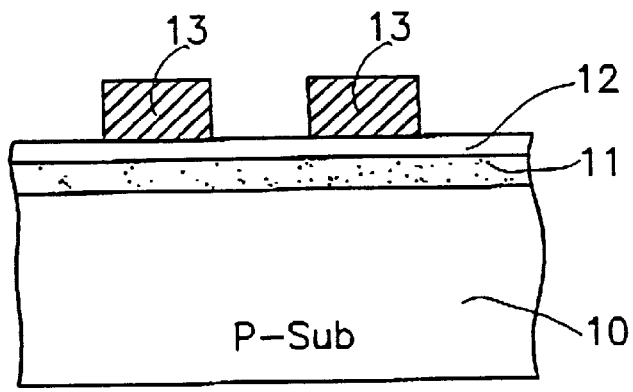
FIG. 1B is a front cross-sectional view of a conventional ROM.
Figure 1C:
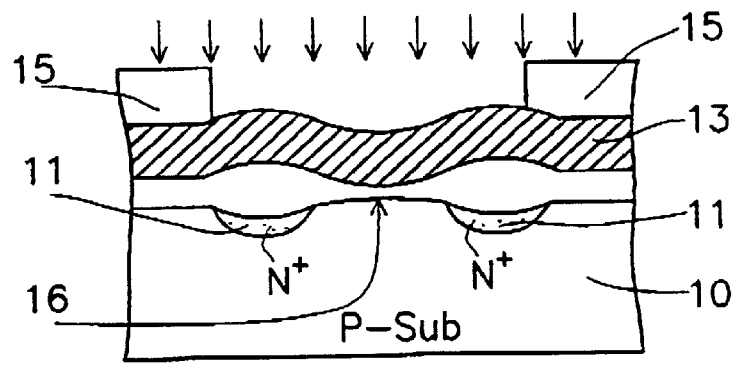
FIG. 1C is a side cross-sectional view of a conventional ROM.
Figures 2A, 2B:
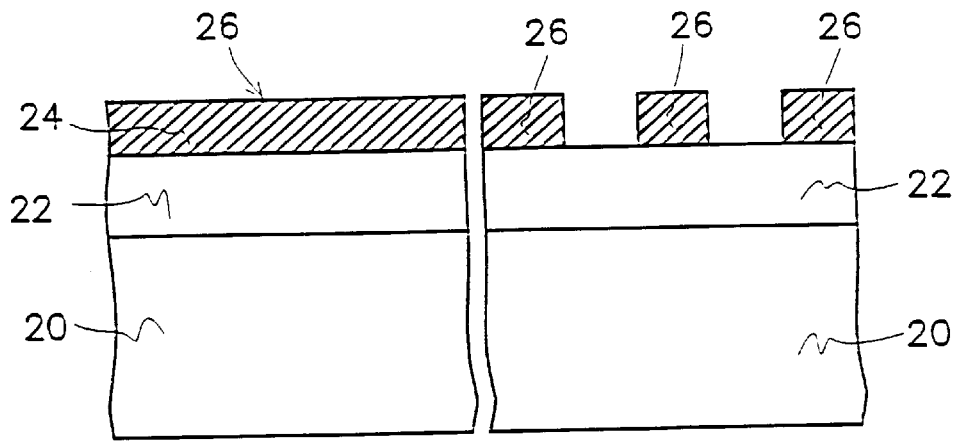
FIGS. 2A to 2F are cross-sectional views of the manufacturing steps of a first memory array of a high density ROM according to a preferred embodiment of the invention.
Figures 2C, 2D:
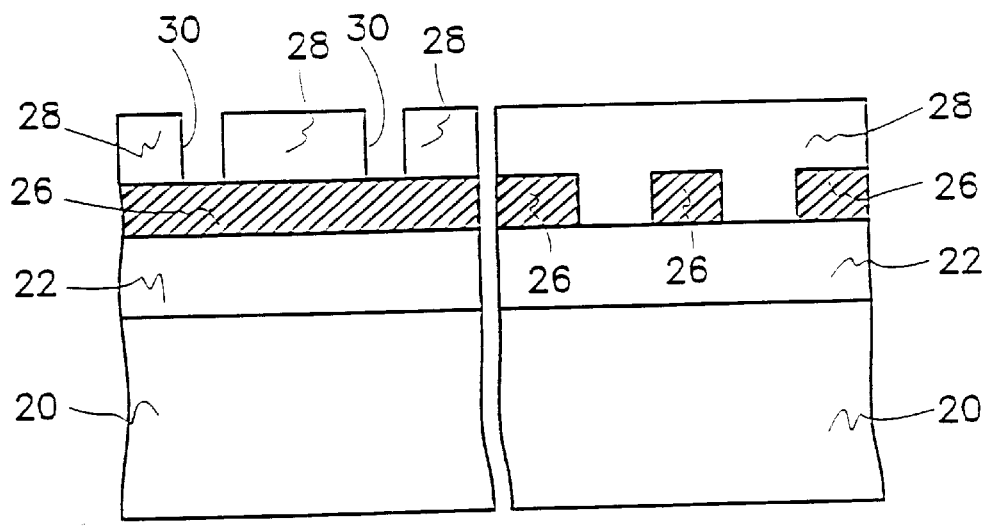
Figures 2E, 2F:
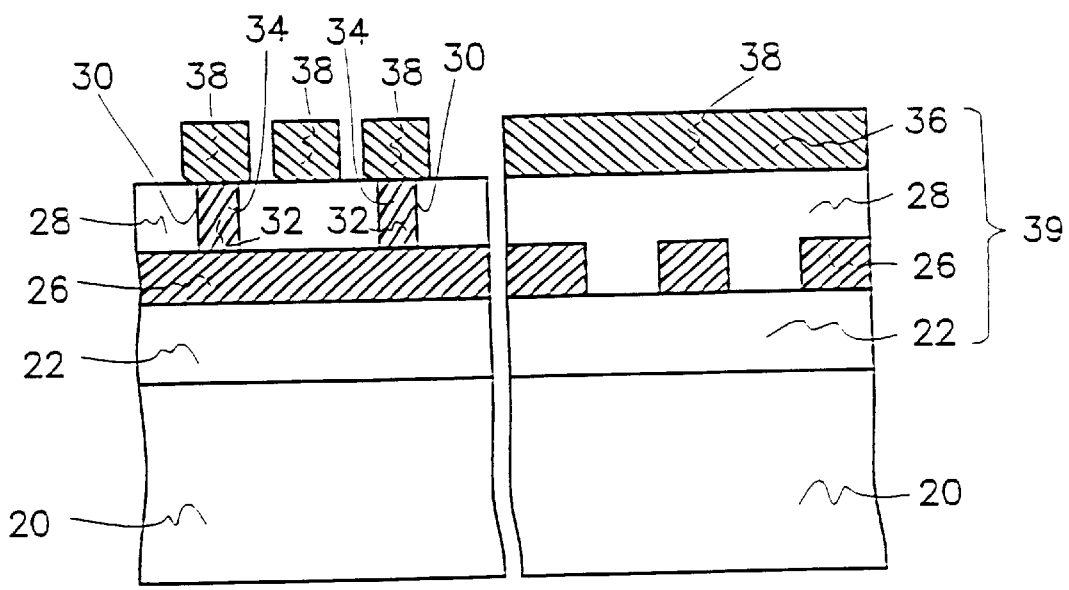

Referring to FIGS. 2A to 2F, the drawings show the manufacturing steps of a memory array of a ROM, according to a preferred embodiment. FIGS. 2A, 2C and 2E are cross-sectional views taken in a direction of the bit lines of the memory cell. FIGS. 2B, 2D and 2F are cross-sectional views taken in a direction perpendicular to the bit lines.

Referring to FIGS. 2A and 2B, a substrate 20 is provided. The substrate 20 may be a P-type substrate. An insulating layer 22 is formed on the substrate 20. The insulating layer 22 may be a silicon dioxide layer formed using wet oxidation. The thickness of the insulating layer 22 is, for example, about 7000 Å to about 10,000 Å. The preferred thickness of the insulating layer 22 is about 8000 Å.

A first metal layer 24 is formed on an upper surface of the insulating layer 22. The metal layer 24 may be aluminum formed by sputtering. The thickness of the metal layer 24 is about 5,000 Å. Using lithography, the metal layer 24 is defined. Then, the metal layer 24 is etched to form plural bit lines 26 which are parallel to each other, with substantially equal spacing between each bit line 26. The etching may be performed using active ions.

Referring now to FIGS. 2C and 2D, an insulating layer 28 is formed over the surface of bit lines 26. The insulating layer 28 may comprise, for example, BPSG (borophosphosilicate glass), and may be a planarized insulating layer. The thickness of the insulating layer 28 is about 7,000 Å to about 10,000 Å. The preferred thickness of the insulating layer 28 is about 8,000 Å. Using lithography and dry etching, a plurality of vias 30 are formed in the insulating layer 28. Each via 30 has a bottom in communication with the bit line 26. The via is used to determine whether the memory cell is turned on or turned off.

Referring next to FIGS. 2E and 2F, a blanket of tungsten 32 is formed over the surface of the substrate 20. The tungsten 32 may be deposited using CVD (Chemical Vapor Deposition). The blanket of tungsten 32 is etched using, for example, dry etching, to remove a portion of the blanket of tungsten 32, leaving tungsten in the respective vias 30, thus forming the tungsten plugs 34.

Next, a metal layer 36 comprised of, for example, aluminum, is formed over the insulating layer 28. The metal layer 36 may be formed using sputtering. The thickness of the metal layer 36 is about, for example, 5,000 Å.

The metal layer 36 is defined using lithography, and then etched to form plural parallel word lines 38 having substantially equal spacing between each other. The metal layer 36 may be etched using active ions. The word lines 38 cross the bit lines 26 at an angle (as viewed from the top), for example, 90°. The crossing point of a respective word line 38 with a respective bit line 26 forms a memory cell. The various layers, from the insulating layer 22 through the word line 38, form a memory array 39.

The memory array 39 is thus formed using the above-described method. By the same method, additional memory arrays may be formed by stacking the arrays, thus enhancing the capacity of the ROM device. In accordance with a preferred embodiment of the invention, a ROM having two memory arrays is used as an example. However, ROMs having more than two arrays can also be formed using the same methods.

Referring to FIGS. 3A to 3H, the fabrication of a second memory array of a ROM according to a preferred embodiment is illustrated. FIGS. 3A, 3C, 3E and 3G are cross-sectional views taken in a direction of the bit lines of the memory cell. FIGS. 3B, 3D, 3F and 3H are cross-sectional views taken in a direction perpendicular to the bit lines of the memory cell.

Figures 3A, 3B:
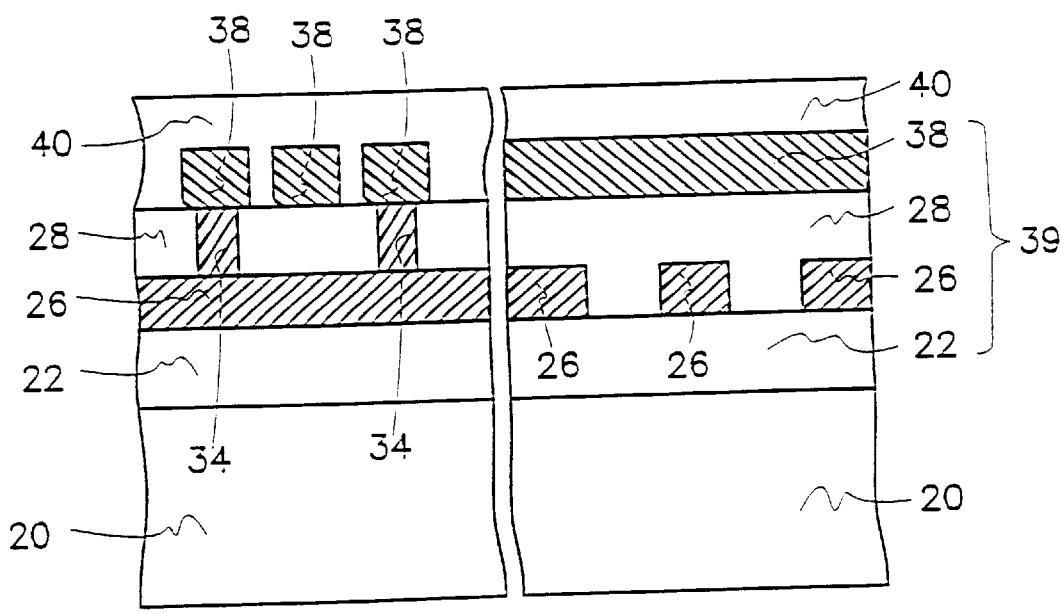
FIGS. 3A to 3H are cross-sectional views of the manufacturing steps of a second memory array of the high density ROM according to a preferred embodiment of the invention.

Referring to FIGS. 3A and 3B, an insulating layer 40 is formed over the array 39. The insulating layer 40 comprises, for example, boron phosphorus silicon glass, and may be a planarized insulating layer. The thickness of the insulating layer 40 is about 7,000 Å to about 10,000 Å. The preferred thickness of the insulating layer 40 is about 8,000 Å. The insulating layer 40 serves to insulate the two memory arrays from each other.

Figures 3C, 3D:
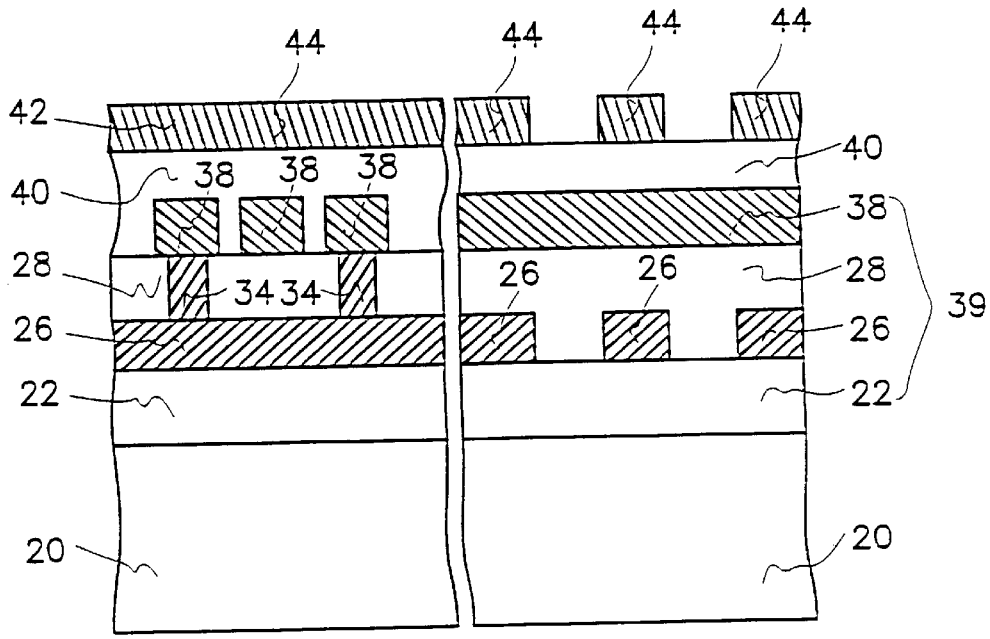

Referring to FIGS. 3C and 3D, a metal layer 42 is formed on an upper surface of the insulating layer 40. The metal layer 42 may be aluminum formed using sputtering. The thickness of the metal layer 42 is about 5,000 Å. Using lithography, the metal layer 42 is defined. Then, the metal layer 42 is etched to form plural bit lines 44 which are parallel to each other, with substantially equal spacing between each bit line 44. The etching may be performed using active ions.

Figures 3E, 3F:
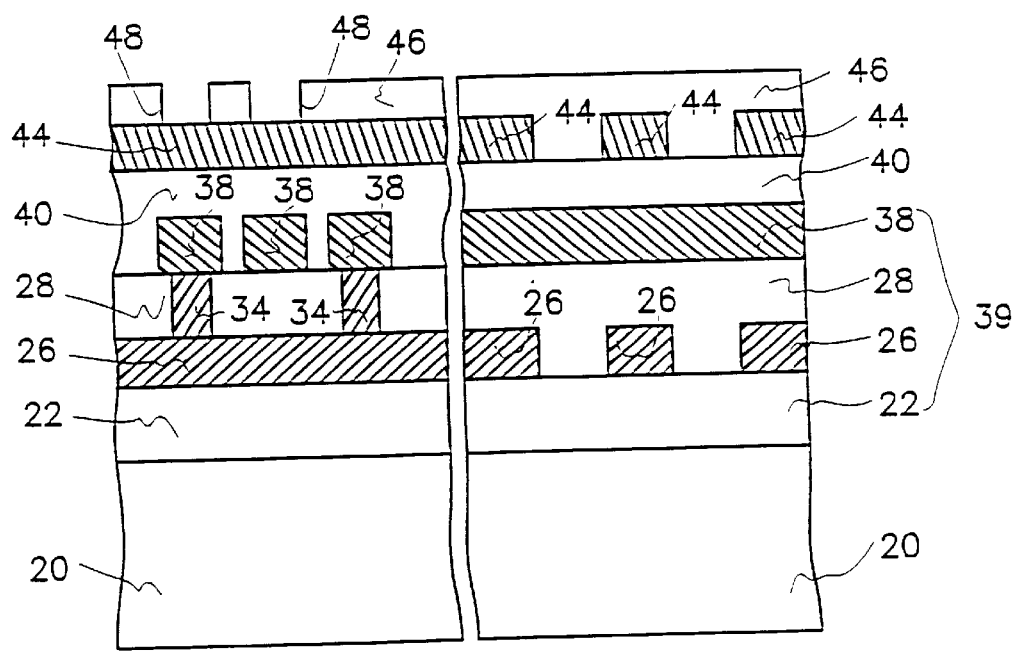

Referring to FIGS. 3E–3F, an insulating layer 46 is formed over the bit lines 44. The insulating layer 46 may comprise, for example, BPSG, and may be a planarized insulating layer. The thickness of the insulating layer 46 is about 7,000 Å to about 10,000 Å. The preferred thickness of the insulating layer 46 is about 8,000 Å. Using lithography and dry etching, a plurality of vias 48 are formed in the insulating layer 46. Each via 48 has a bottom in communication with the bit line 44. Each via 48 is used to determine if the corresponding memory cell is turned on or off.

Figures 3G, 3H:
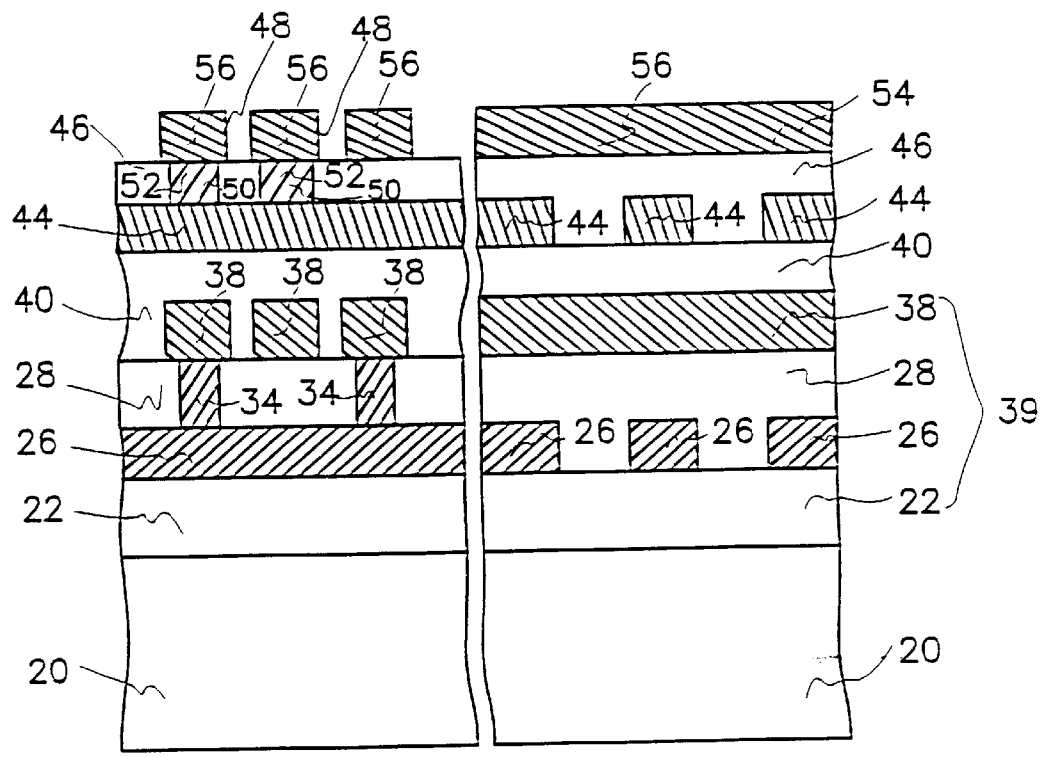

Referring to FIGS. 3G–3H, a blanket of tungsten 50 is formed over the substrate 20. The tungsten 50 may be deposited using CVD (Chemical Vapor Deposition). The blanket of tungsten 50 is etched using, for example, dry etching, to remove a portion of the tungsten 50, leaving tungsten in the respective vias 48, thus forming tungsten plugs 52.

Next, a metal layer 54 including, for example, aluminum, is formed over the insulating layer 46. The metal layer 54 may be formed using sputtering. The thickness of the metal layer 54 is about 5,000 Å. The metal layer 54 is defined using lithography, and then etched to form plural parallel word lines 56 having substantially equal spacing between each other. The metal layer 54 may be etched using active ions. The word lines 56 cross the bit lines 44 at an angle (as viewed from the top), for example, 90°. The crossing point of a respective word line 56 with a respective bit line 44 forms a memory cell. The various layers, from the insulating layer 40 through the word line 56, form a memory array 57.

Figure 4:
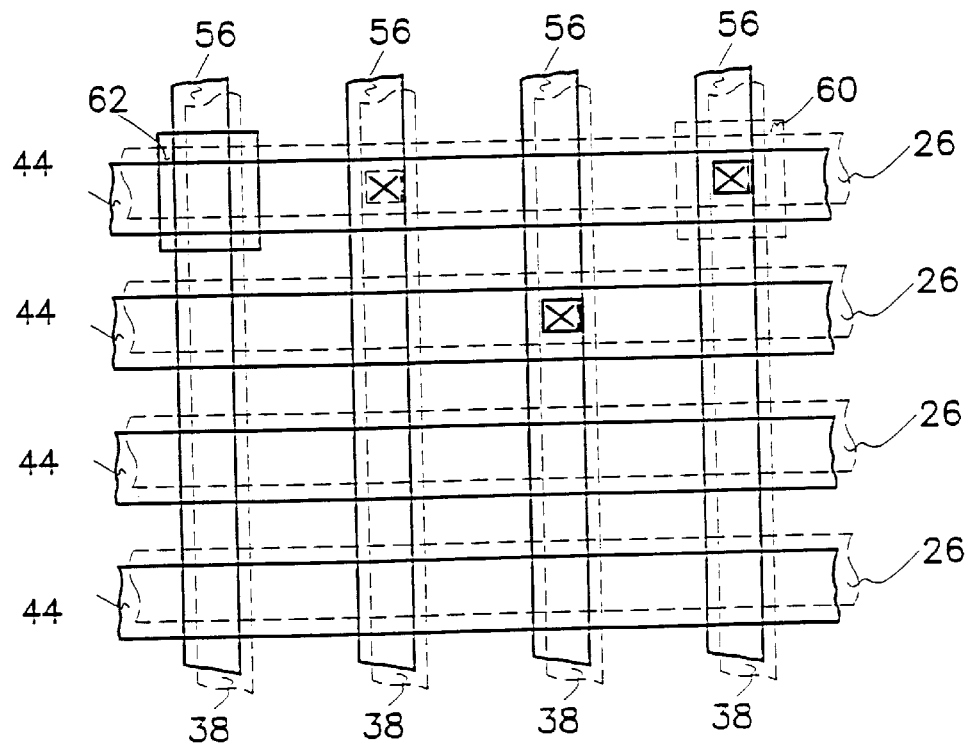
FIG. 4 is a top view of the high density ROM according to a preferred embodiment of the invention.

FIG. 4 is a top view of a high density ROM having two memory arrays in accordance with the preferred embodiment. In the Figure, the bit lines 26 and the word lines 38, which are drawn with the dotted line, form a bottom layer of the ROM device. The block 60, which is drawn with the dotted line, is a memory cell of the bottom layer. Bit lines 44 and word lines 56 form an upper layer of the ROM device. The block 62 is a memory cell of the upper layer.

The above described invention has several advantages, such as:

1) forming the bit line and the word line of metal increases the operating current and simplifies the manufacturing process;

2) forming the bit line and the word line of metal prevents the channel length effect, current leakage, and so on;

3) because the presence or absence of a via determines whether the memory cell is turned on or off, the encoding method is simplified; and 4) since the ROM array is stacked tridimensionally, the integratability of the MOS device is increased, and a high density ROM is formed.

While the invention has been described by way of example and in terms of preferred embodiments, it is to be understood that the invention is not limited to the disclosed embodiments. To the contrary, it is intended to cover various modifications and similar arrangements. The scope of the appended claims, therefore, should be accorded the broadest interpretation so as to encompass all such modifications and similar structures.

What is claimed is:

1. A high density ROM device, comprising:
a substrate; and
at least one memory array, including:
a first insulating layer located over a surface of the substrate,
plural bit lines located over the first insulating layer and extending in a first direction, said bit lines being spaced from one another at essentially equal intervals;
a second insulating layer formed over the plural bit lines,
at least one via formed in the second insulating layer and exposing a portion of the bit lines, and
plural word lines located over the second insulating layer and extending in a second direction that crosses the first direction to form an angle, said word lines being spaced from one another at essentially equal intervals; and
wherein some of the word lines are connected to the bit lines using the via and some of the word lines are isolated from the bit lines using the second insulating layer.

2. The device according to claim 1, wherein said first insulating layer comprises silicon dioxide.

3. The device according to claim 1, wherein said bit lines comprise aluminum.

4. The device according to claim 1, wherein said second insulating layer comprises borophosphosilicate glass.

5. A device according to claim 1, further comprising tungsten filling the via so that the tungsten electrically connects a respective bit line to a respective word line.

6. A device according to claim 1, wherein said word lines comprise aluminum.

7. A device according to claim 1, wherein the angle is about 90°.

8. A device according to claim 1, wherein the formation of the via determines an "ON" and "OFF" condition of the device.

9. A high density ROM device, comprising:
a substrate; and
at least one memory array, including:
a plurality of bit lines located over the substrate and extending in a first direction, the bit lines being separated from one another by essentially equal intervals;
a plurality of word lines located over the bit lines and extending in a second direction that crosses the first direction to form an angle, the word lines being separated from one another by essentially equal intervals; and
a plurality of vias, each being filled with tungsten, a portion of the bit lines being electrically coupled with a portion of the word lines by the vias and a portion of the bit lines being electrically insulated with the word lines.

10. A high density ROM device, comprising:
a substrate; and
at least one memory array, including:
a first insulating layer located over a surface of the substrate;
a plurality of bit lines located over the first insulating layer and extending in a first direction, the bit lines being separated from one another by essentially equal intervals;
a second insulating layer formed over the bit lines;
a plurality of tungsten plugs formed in the second insulating layer and connected to a portion of the bit lines; and
a plurality of word lines located over the second insulating layer and extending in a second direction that crosses the first direction to form an angle, the word lines being separated from one another by essentially equal intervals, wherein a portion of the word lines is connected to the tungsten plugs, and a portion of the word lines is isolated from the bit lines by the second insulating layer.

* * * * *